(12) United States Patent
Chong et al.

(10) Patent No.: US 10,145,868 B2
(45) Date of Patent: Dec. 4, 2018

(54) SELF-REFERENCED ON-DIE VOLTAGE DROOP DETECTOR

(71) Applicant: Ampere Computing LLC, Santa Clara, CA (US)

(72) Inventors: Yan Chong, San Jose, CA (US); Luca Ravezzi, San Francisco, CA (US); Alfred Yeung, Fremont, CA (US); Hamid Partovi, Menlo Park, CA (US)

(73) Assignee: AMPERE COMPUTING LLC, Santa Clara, CA (US)

( * ) Notice: Subject to any disclaimer, the term of this patent is extended or adjusted under 35 U.S.C. 154(b) by 224 days.

(21) Appl. No.: 15/068,737

(22) Filed: Mar. 14, 2016

(65) Prior Publication Data

US 2017/0261537 A1 Sep. 14, 2017

(51) Int. Cl.
  *G01R 19/00* (2006.01)
  *G01R 19/165* (2006.01)
  *G01R 17/02* (2006.01)

(52) U.S. Cl.
  CPC ....... *G01R 19/16504* (2013.01); *G01R 17/02* (2013.01); *G01R 19/0084* (2013.01)

(58) Field of Classification Search
  CPC ............. G01R 31/3658; G01R 31/026; G01R 31/3277; G01R 15/144; G01R 15/146; G01R 17/02; G01R 19/0084; G01R 19/0092; G01R 19/10; G01R 19/16504; G01R 19/16552; G01R 19/16571; G01R 19/2509; G01R 1/203; G01R 27/205; G01R 31/025; G01R 31/028; G01R 31/3004; G01R 31/3274; G01R 31/343; G01R 31/346; G01R 31/3606; G01R 31/361; G01R 31/362; G01R 31/3624; G01R 31/3662; G01R 31/3679; G01R 31/3682; G01R 33/1269; G06F 1/26; G06F 1/28; G06F 1/3206; G06F 1/3225;
  (Continued)

(56) References Cited

U.S. PATENT DOCUMENTS 6,586,971 B1 7/2003 Naffziger et al.
6,882,238 B2 * 4/2005 Kurd ................ G01K 7/32
                                              331/185
(Continued)

FOREIGN PATENT DOCUMENTS

WO 2004-095240 11/2004

OTHER PUBLICATIONS

International Search Report & Written Opinion for PCT Application Serial No. PCT/US2017/022022, dated Jun. 7, 2017, 11 pages.

*Primary Examiner* — Vinh Nguyen
(74) *Attorney, Agent, or Firm* — Alston & Bird LLP

(57) ABSTRACT

A self-referenced on-die voltage droop detector generates a reference voltage from the supply voltage of an integrated circuit's power distribution network, and compares this reference voltage to the transient supply voltage in order to detect voltage droops. The detector responds to detected occurrences of voltage droop with low latency by virtue of being located on-die. Also, by generating the reference voltage from the integrated circuit's power domain rather than using a separate reference voltage source, the detector does not introduce noise and distortion associated with a separate power domain.

18 Claims, 8 Drawing Sheets

(58) Field of Classification Search
CPC ...... G06F 1/3228; G06F 1/329; G06F 1/3296; H02P 6/12; H02P 6/16; H02P 6/26; H03G 3/001; H03G 3/3047; H04B 5/0037; H04B 5/0043

See application file for complete search history.

(56) References Cited

U.S. PATENT DOCUMENTS

| | | |
|---|---|---|
| 6,922,111 B2 | 7/2005 | Kurd et al. |
| 7,133,751 B2 | 11/2006 | Kurd et al. |
| 7,157,924 B2 | 1/2007 | Muhtaroglu et al. |
| 7,528,619 B2 | 5/2009 | Paillet et al. |
| 7,937,563 B2 | 5/2011 | Naffziger et al. |
| 8,269,544 B2 | 9/2012 | Greenhill et al. |
| 8,847,777 B2 | 9/2014 | Ramaswami |
| 8,933,737 B1 | 1/2015 | Chatterjee et al. |
| 2007/0192636 A1 | 8/2007 | Gonzalez et al. |
| 2012/0242490 A1 | 9/2012 | Ramaswami |
| 2015/0102833 A1 | 4/2015 | Bhatia |

\* cited by examiner

SELF-REFERENCED ON-DIE VOLTAGE DROOP DETECTOR

TECHNICAL FIELD

The subject disclosure relates generally to electrical design, and, for example, to a self-referenced on-die voltage droop detector that provides on-die detection of system level voltage droop due to transient current surges.

BACKGROUND

Integrated circuits, such as system-on-chip (SoC) designs or other very-large-scale-integration (VLSI) systems, comprise a number of circuit elements or components that receive supply voltage from one or more on-die power grids or power distribution networks (PDNs). Although the PDN is designed to supply a nominal operating voltage to the integrated circuit components, a number of operating factors can cause the voltage supplied by the PDN to temporarily drop below this nominal operating voltage, a condition referred to as voltage droop. Supply voltage droop may result when the integrated circuit experiences a sudden increase in switching activity, resulting in transient surges in current draw that may produce a droop in the supply voltage.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a system for detecting voltage droops is provided, comprising a voltage reference generator component configured to convert a supply voltage of a power distribution network of an integrated circuit to a reference voltage; and a comparator component configured to generate a comparison result output signal in response to a determination that a transient voltage representing the supply voltage has deviated from the reference voltage in excess of a margin.

Also, a method of detecting droops in supply voltage is provided, comprising converting, by one or more on-die components of an integrated circuit, a supply voltage of a power distribution network of an integrated circuit to a reference voltage; and generating, by the one or more on-die components, a comparison result signal in response to determining that a transient voltage representing the supply voltage has deviated from the reference voltage in excess of a margin.

In addition, an integrated circuit is provided, comprising a power distribution network that provides a supply voltage to one or more integrated components of the integrated circuit; a voltage divider component configured to divide the supply voltage into a bus of different voltages; a low-pass filter component configured to generate a transiently averaged sampled version of a first voltage of the bus of different voltages, wherein the low-pass filter component filters the transiently averaged sampled version of the first bus voltage to approximately one-tenth of system resonant frequency to yield a filtered voltage; a unit-gain amplifier component configured to buffer the filtered voltage to yield a reference voltage; a comparator component configured to compare the reference voltage with a second voltage of the buss of different voltage and to generate a comparison result signal in response to determining that the second voltage has deviated from the reference voltage in excess of a tolerance; and a sampling component configured to synchronously sample the comparison result single and to output a droop detection signal in response to detecting the comparison result output signal.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
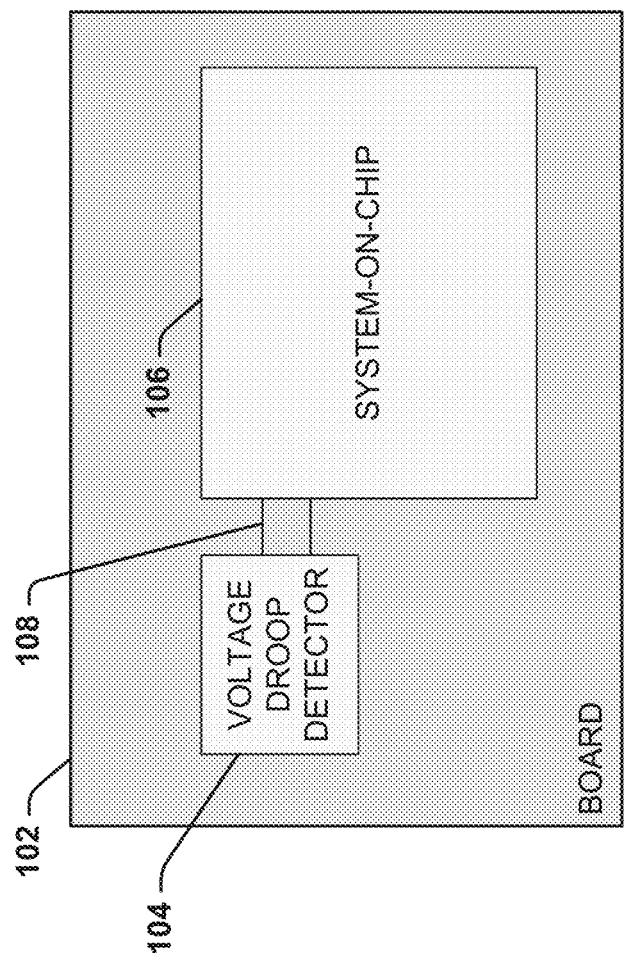
FIG. 1 is a generalized diagram illustrating a technique for detecting voltage droop in an example system-on-chip.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Integrated circuits, such as system-on-chip (SoC) designs or other very-large-scale-integration (VLSI) systems, are sometimes susceptible to droops in the supply voltage provided to the circuit components via the circuit's supply power domain. These supply voltage droops may be caused by a sudden increase in current consumption by the circuit's active components (e.g., during a brief period when there is a high level of simultaneous switching activity by the circuit's switching components). These supply voltage droops can adversely affect the performance of an SoC or other VLSI.

Designers of SoCs or other integrated circuits may wish to monitor or detect voltage droops during system testing and debug for the purpose of characterizing the system's power supply drooping. This information can be used to design the system for improved voltage droop control. It may also be beneficial to monitor voltage droops during normal circuit operation in order to dynamically compensate for detected power supply droops using Dynamic Voltage and Frequency Scaling (DVFS), thereby improving power performance.

Voltage droop may be detected using a number of different approaches. FIG. 1 is a generalized diagram illustrating a technique for detecting voltage droop for an example SoC 106. In this example approach, a voltage droop detector 104 is placed on the printed circuit board (PCB) 102 separately from the SoC itself. A pair of matched observation traces 108 connect the voltage droop detector 104 to the die power network of the SoC 106, allowing the detector 104 to observe voltage droops on the die. However, since the voltage droop observation will be time delayed due to the parasitic from the package and board trace, this approach is only useful for observation purposes, and cannot be used to dynamically compensate for voltage droops using DVFS due to high response latency.

Figure 2:
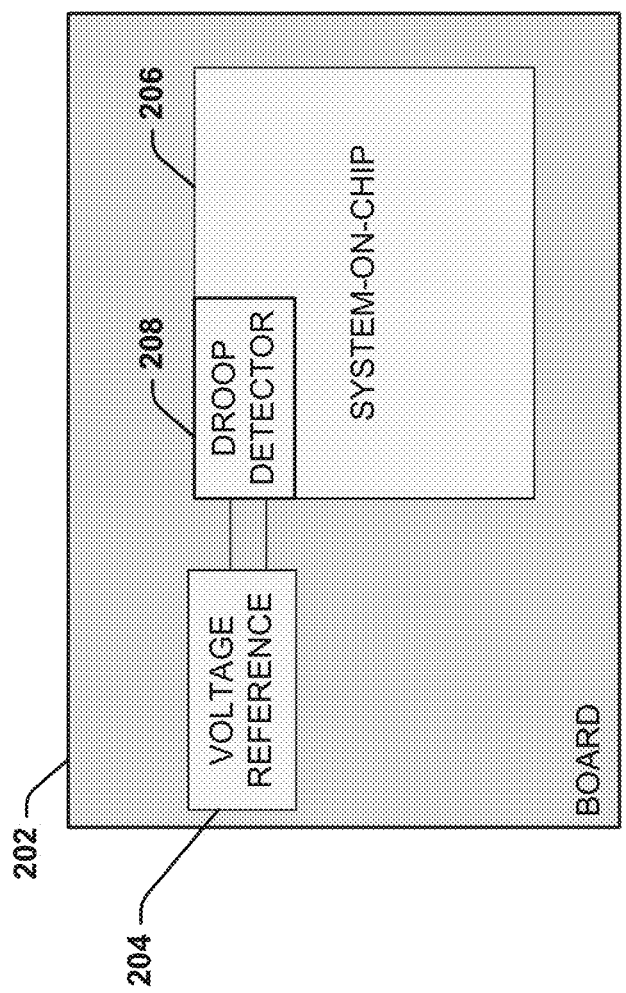
FIG. 2 is a generalized diagram illustrating another technique for detecting voltage droop.

FIG. 2 is a generalized diagram illustrating another technique for detecting voltage droop. This example approach employs an on-die voltage droop detector 208, which is an integrated component of the SoC 206. According to this approach, the voltage droop detector 208 detects drops on the SoC's voltage supply by comparing the supply voltage with an external voltage reference 204 located on the PCB 102. However, this approach requires additional circuit routing to connect the second voltage domain associated with the external voltage reference 204 to the on-die droop detector 208. Moreover, addition of an external reference voltage domain can introduce supply noise native to the reference domain, and droop detection using this method may lack sufficient precision for the purposes of design or dynamic droop compensation.

To address these and other issues, one or more embodiments described herein provide a self-referenced on-die droop detector, which offers a number of benefits relative to the techniques described above. For example, the self-referenced detector is located on-die, allowing the detection results to be sent to other on-die components with low latency, and limits the amount of noise produced by the detection system. Also, since the droop detector is self-referenced—that is, draws its reference voltage from the SoC's power domain—the comparator is free of noise and distortion associated with a separate voltage domain. Moreover, the resource overhead (in terms of the die, bumps, package, and board) associated with an external voltage reference is not required.

Figure 3:
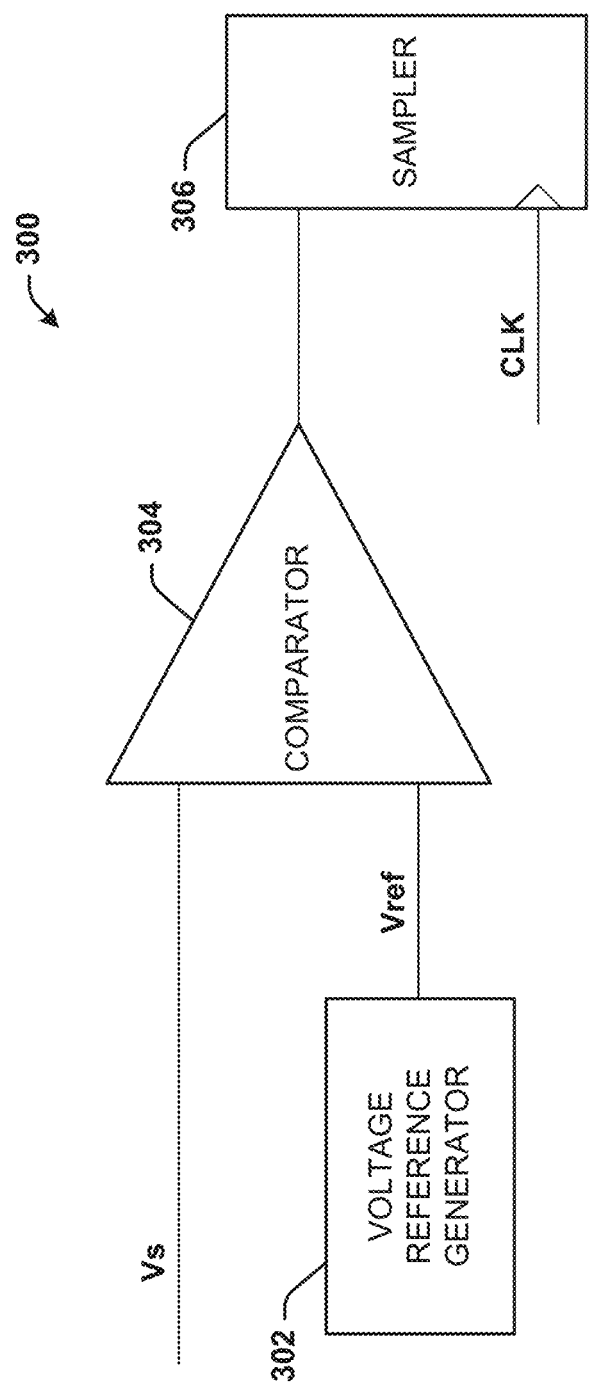
FIG. 3 is a high-level diagram of an example self-referenced on-die voltage droop detector.

FIG. 3 is a high-level diagram of an example self-referenced on-die voltage droop detector 300, illustrating basic components of the detector. The detector 300 is an integrated component of an SoC or other integrated circuit, and is used to detect droops of the SoC's supply voltage due to high switching activity, sudden increases in current consumption, or other such causes. Self-referenced on-die droop detector 300 includes a voltage reference generator 302 (to be described in more detail below) that generates a reference voltage Vref, which is used as a gauge for the transient voltage of the SoC or other integrated circuit of which the detector is an on-die component. This reference voltage Vref is supplied to a comparator 304 together with the transient voltage Vs, which is generated to represent the power grid of the SoC with a certain margin from the reference voltage Vref. Comparator 304 asserts its output in response to detecting that the transient voltage has fallen below the reference voltage in excess of a margin of tolerance, indicating a voltage droop. The output of comparator 304 is synchronously sampled by a sampler 306, which is driven by clock signal CLK.

The output of the detector 300 can be provided to one or more other integrated components of the SoC or to an external system, depending on the application in which the detector is used. In an example application, detector 300 can be used with a logic control block or other components to control the SoC's clock frequency in accordance with a Dynamic Voltage and Frequency Scaling application. For example, when the sampler 306 detects that the output of comparator 304 has been asserted, indicating that the transient voltage Vs of the system has dropped below the reference voltage Vref, the detector 300 can provide a signal to a logic control block requesting that the clock frequency of the SoC be slowed down, or requesting that clock skipping be initiated, in order to reduce chip level activity, thereby reducing current draw by the integrated circuit components to a safe level and compensating for the transient voltage drop. When the detector 300 has detected that the transient voltage has returned to nominal operating levels (based on the output of comparator 304), the detector 300 can send a signal to the logic control block requesting that the system clock be gradually returned to normal. This dynamic control of the SoC's system clock in response to detected voltage droops can reduce the power and performance margin while still maintaining safe SoC operation. This application of the self-referenced on-die droop detector is only intended to be exemplary, and it is to be appreciated that the detector 300 can be used within the context of other applications without departing from the scope of one or more embodiments described herein.

Figure 4:
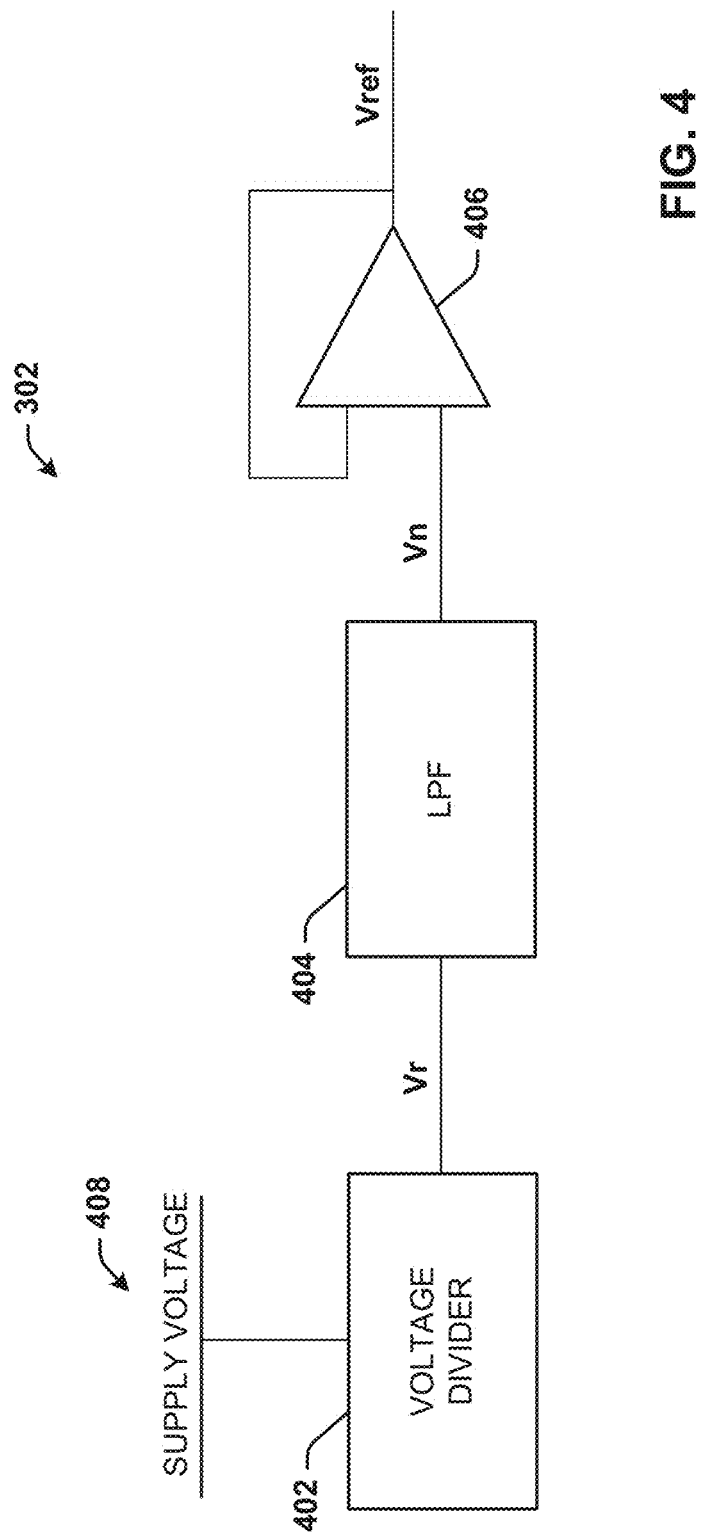
FIG. 4 is a diagram illustrating an example voltage reference generator that can be used as part of a self-referenced on-die voltage droop detector.

FIG. 4 is a diagram illustrating the voltage reference generator 302 of FIG. 3 in more detail. As noted above, the detector 300 generates its reference voltage Vref using the SoC's supply power domain rather than relying on an external voltage reference in order to avoid introducing supply noise from an additional power domain, as well as to mitigate the need for additional routing to connect the external voltage reference to the die. To this end, the voltage reference generator 302 includes a voltage divider 402, which receives voltage from the on-die supply voltage via power supply bus 408, and creates a bus of different voltages that are generated from this on-die supply voltage. In one or more embodiments, the voltage divider bus can track the voltage resistively.

One of the voltages from the bus of voltages created by the voltage divider 402 is selected to be Vs, the transient voltage to be compared with the reference voltage Vref (see FIG. 3). In one or more embodiments, Vs can be selected from the bus of voltages by providing the different voltages as inputs to a multiplexer, which is configured to output a selected one of the voltages as Vs. This voltage Vs is provided to comparator 304, as shown in FIG. 3.

Figure 5:
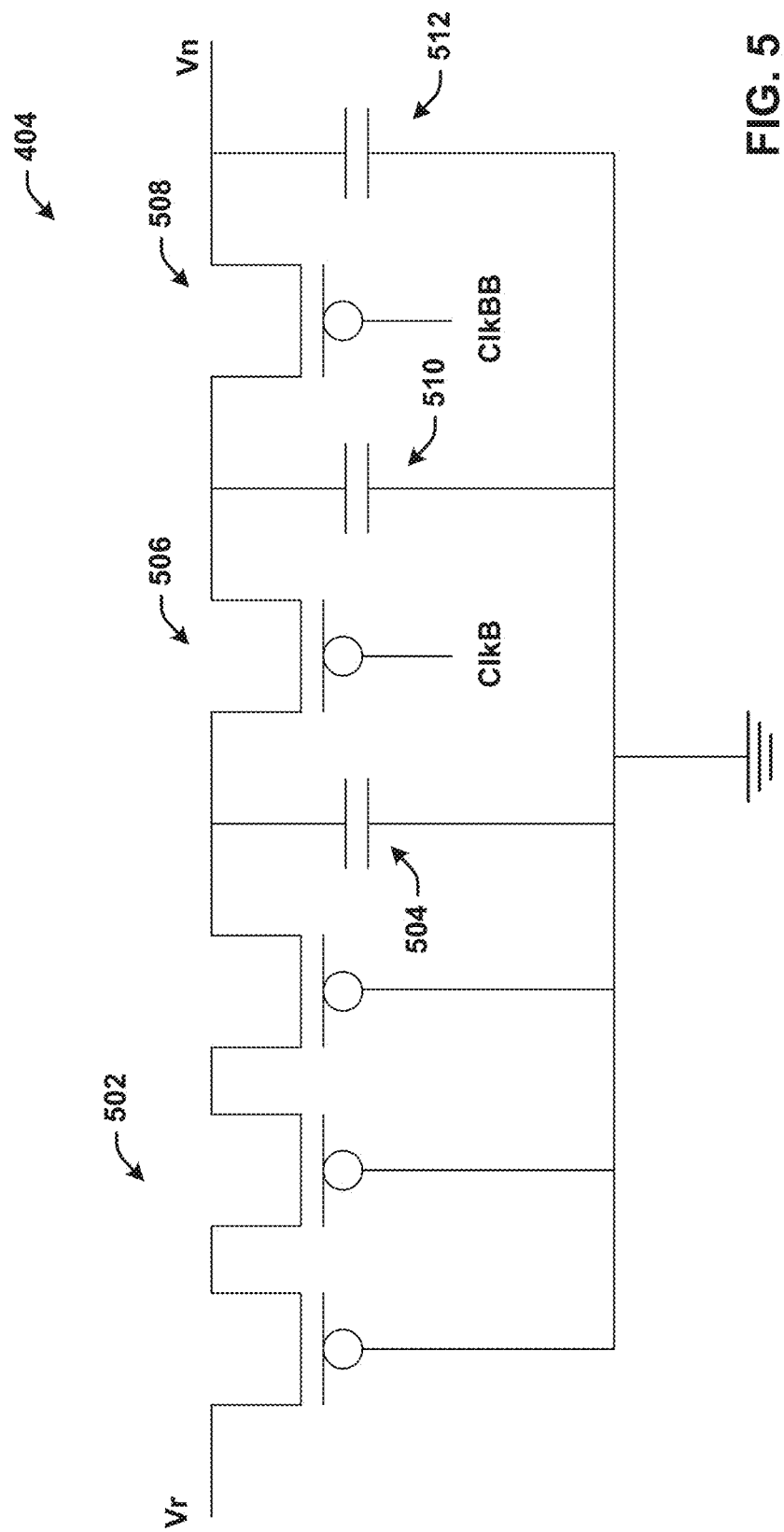
FIG. 5 is an example low-pass filter that can be used as part of a voltage reference generator of a self-referenced on-die voltage droop detector.

In addition, the lowest voltage from the bus of voltages created by voltage divider 402 is sent to a low-pass filter (LPF) 404 as Vr, as shown in FIG. 4. The low-pass filter 404 is designed to filter high frequency noises of the supply voltage in order to produce a stable reference voltage for comparison with transient voltage Vs. To this end, this low-pass filter 404 produces a transiently averaged or time-averaged sampling of voltage Vr. Turning briefly to FIG. 5, an example low-pass filter 404 that can be used in the voltage reference generator 302 is illustrated. In one or more examples, low-pass filter 404 can be based on a basic resistor-capacitor (RC) filter combined with a switch capacitor to provide a filtering of voltage Vr down to one-tenth of the estimated design resonant frequency. Example low-pass filter 404 comprises a number of series-connected metal-oxide-semiconductor field-effect transistors (MOSFETs) 502 with gates tied to ground, and a first capacitive element 504. Together, MOSFETs 502 and capacitive element 504 yield resistive and capacitive elements, respectively, for the low-pass filter 404. Low-pass filter 404 also includes two switched capacitors 510 and 512 respectively controlled by clock pulse signals ClkB and ClkBB, which are inverted relative to each other. Capacitor 510 receives the voltage on capacitive element 504 when MOSFET 506 switches to the closed position based on the state of clock signal ClkB, which is tied to the gate of MOSFET 506. Capacitor 512 receive the voltage from capacitor 510 when MOSFET 508 switches to the closed position based on the state of clock signal ClkBB, which is inverted relative to clock signal ClkBB and tied to the gate of MOSFET 508. In one or more embodiments, the frequencies of clock signals ClkB and ClkBB can be a function of the frequency of the system clock of the SoC. According to this design, the RC constant (and thus the cutoff frequency) of the low-pass filter 404 can be set as a function of clock frequency. This filter design can yield a suitable filtering bandwidth without the need for large resistors and capacitors, which would otherwise consume a larger amount of chip resources.

The output voltage Vn of low-pass filter 404 is a transiently averaged sampling of the supply voltage (as represented by Vr) over time. The filter 404 can filter voltage Vr down to a suitably low frequency—e.g., one-tenth of resonant frequency—to yield output voltage Vn. Since the resonant frequency of the supply voltage droops to be monitored is on the order of hundreds of MHz, a 5 MHz filtering frequency is sufficiently low to produce a steady reference voltage.

Returning to FIG. 4, the filtered output voltage Vn of low-pass filter 404 is buffered using a unity-gain amplifier 406, which produces a buffered version of voltage Vn for consumption by the comparator 304. This buffered version of Vn is provided to comparator 304 as Vref for comparison with the transient voltage Vs. As a general design consideration, the offset for the unity-gain amplifier can be minimized to improve accuracy of droop detection. Any suitable circuit technique can be used to reduce the offset of the unity-gain amplifier, including but not limited to offset auto-cancellation.

Figure 6:
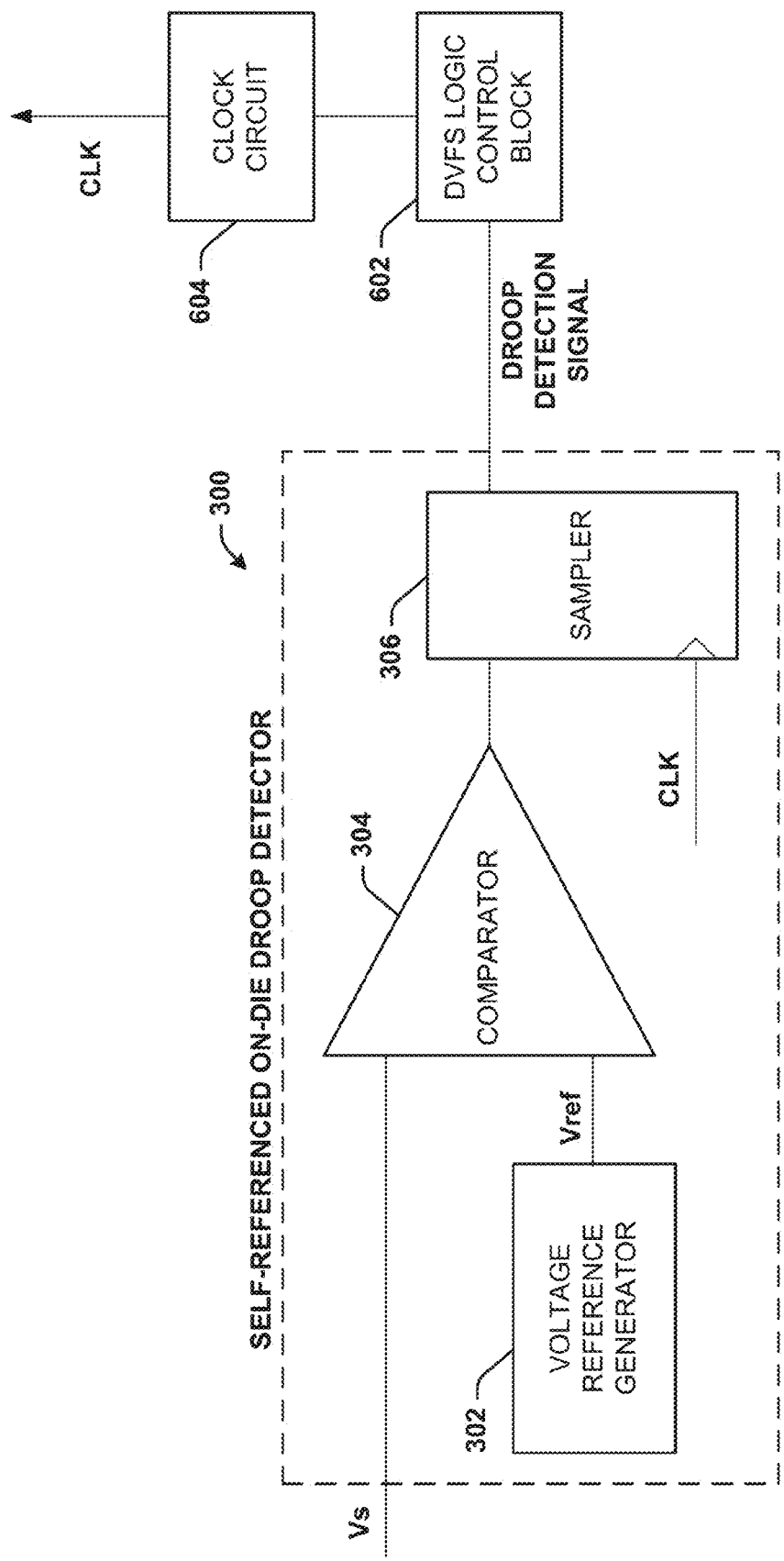
FIG. 6 is a diagram illustrating an example on-die Dynamic Voltage and Frequency Scaling (DVFS) system that includes a self-referenced on-die voltage droop detector.

As noted above, the self-referenced on-die droop detector can be implemented as a component of an on-die DVFS system to dynamically compensate for supply voltage droops. FIG. 6 is a diagram illustrating an example on-die DVFS implementation. In this example, operations carried out by components of an integrated circuit (e.g. an SoC or other VLSI system) are driven by a system clock pulse signal CLK produced by clock circuit 604, which ensures synchronized operation of the circuit components. The output of the detector 300 is provided to a DVFS logic control block 602, which is configured to control the frequency of the clock signal generated by clock circuit 604 in response to detection of a supply voltage droop by the droop detector 300. For example, in response to receiving a signal from the droop detector 300 indicating that a supply voltage droop has occurred, the DVFS logic control block 602 sends a signal to the clock circuit 604 that reduces the frequency of the clock signal output, or causes the clock circuit to enter a mode in which clock cycles are skipped. This temporarily reduces chip-level activity in response to the detected voltage droop, thereby reducing overall current consumption by the circuit components and reducing the load on the supply voltage. This reduced current consumption can assist in bringing the supply voltage back to an acceptable level while allowing the system to continue operating within normal performance parameters. When the output of the droop detector 300 indicates that the supply voltage has returned to normal levels (i.e., the voltage droop condition has been eliminated), the DVFS logic control block 602 will instruct the clock circuit 604 to gradually return the system clock signal to its normal frequency.

Droop detector 300 is suitable for use in such DVFS systems by virtue of the fact that the droop detector 300 resides on the die, which ensures low latency responses to detected voltage droops. Moreover, since the reference voltage for the droop detector is derived from the same supply voltage that powers the SoC components (as opposed to using a voltage reference from a different power domain), the system remains free of noise and distortion that would otherwise be introduced by another voltage supply.

It is to be appreciated that the self-referenced on-die droop detector 300 is not limited to use within a DVFS application. For example, in other example scenarios the droop detector 300 may be used strictly for observational purposes; e.g., by outputting indications of detected supply voltage droops to an external monitoring or recording system that displays and/or maintains a record of voltage droop occurrences. Other applications of the self-referenced on-die droop detector are also within the scope of one or more embodiments described herein.

Figure 7:
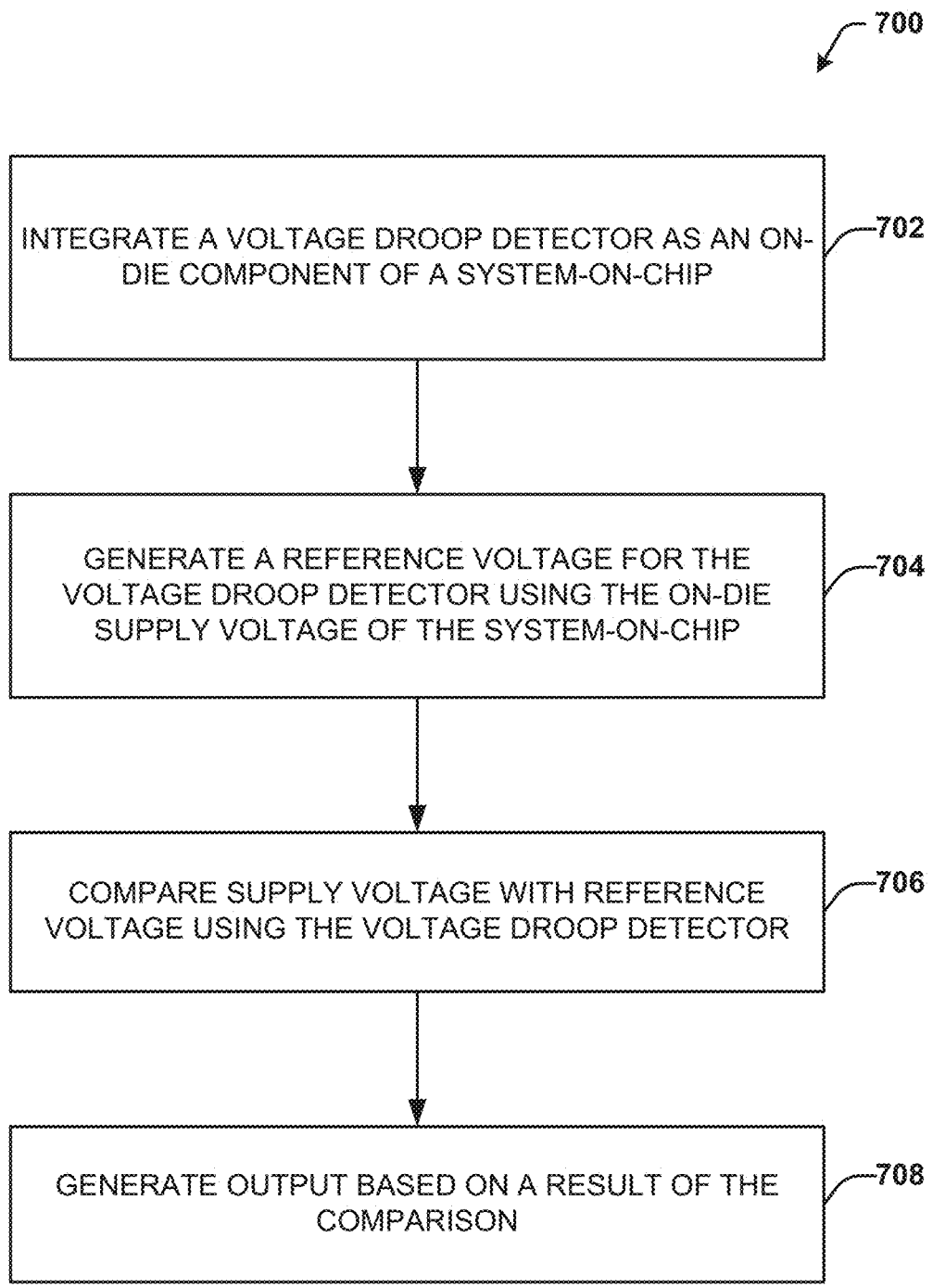
FIG. 7 is a flow diagram of an example, non-limiting embodiment for detecting voltage droops on the power grid of a system-on-chip or other VLSI system.
Figure 8:
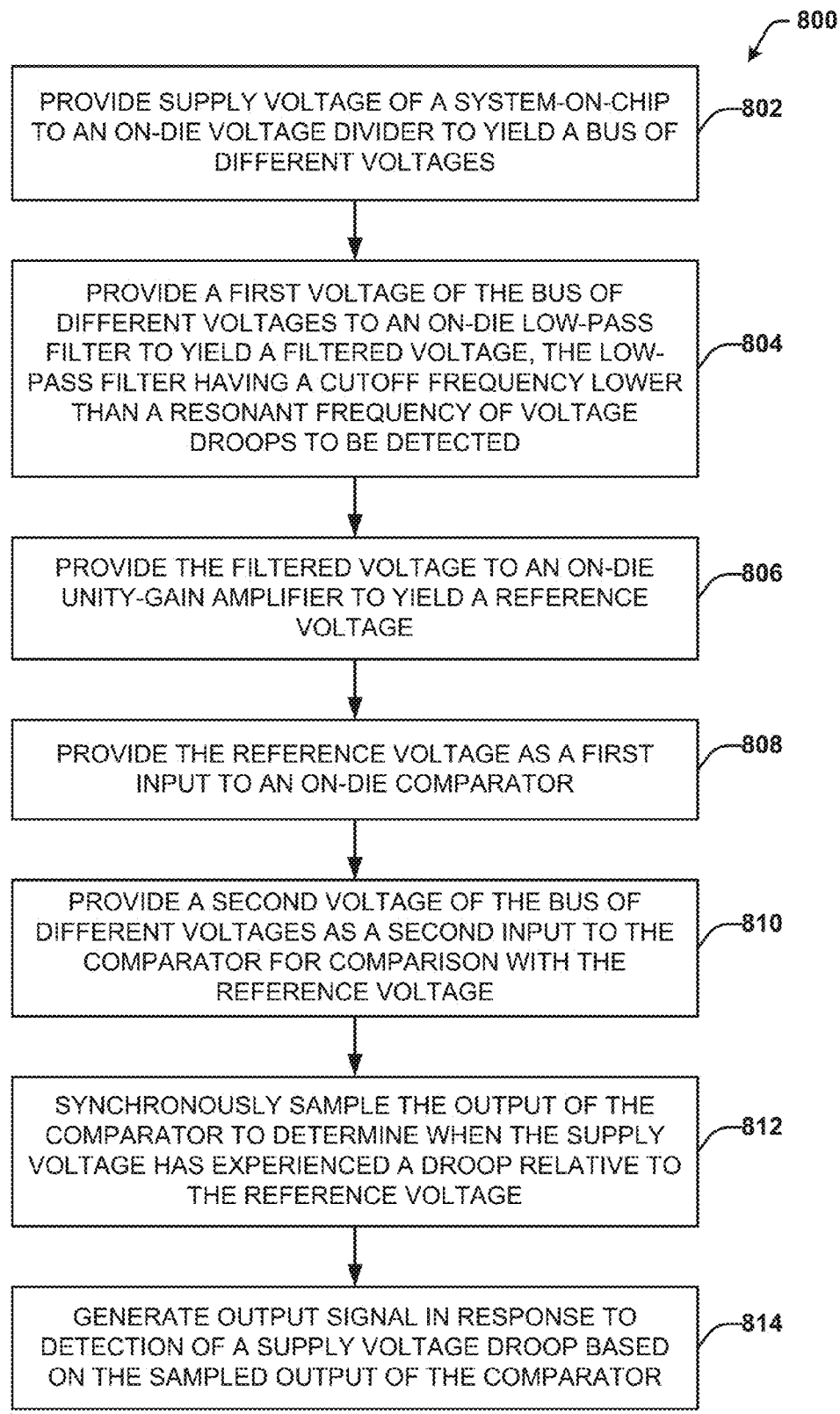
FIG. 8 is a flow diagram of an example, non-limiting embodiment for detecting voltage droops on the power grid of a system-on-chip or other VLSI system.

FIGS. 7-8 illustrate methodologies in accordance with one or more embodiments of the subject application. While, for purposes of simplicity of explanation, the methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 7, a flow diagram of an example, non-limiting embodiment for detecting voltage droops on the power grid of a system-on-chip or other VLSI system is shown. Method 700 can begin at block 702, where a voltage droop detector is integrated as an on-die component of a system-on-chip (SoC). At 704, a reference voltage for the voltage droop detector is generated using the on-die supply voltage for the SoC. For example, the reference voltage can be obtained by filtering and buffering a portion of the supply voltage to yield a steady reference voltage that can be compared with a voltage representative of the SoC's power grid. At 706, the supply voltage on the SoC's power grid (or an analogous representation of the supply voltage) is compared with the reference voltage obtained at step 704 using the voltage droop detector. At 708, an output is generated based on a result of the comparison performed at step 706. This result, which indicates occurrence of droop in the SoC's supply voltage, can be used to initiate a Dynamic Voltage and Frequency Scaling (DVFS) countermeasure, or may be used for strictly observational purposes.

Referring to FIG. 8, a flow diagram of an example, non-limiting embodiment for detecting voltage droops on the power grid of a system-on-chip or other VLSI system is shown. Method 800 can begin at block 802, where the supply voltage of an SoC is provided to an on-die voltage divider to yield a bus of different voltages. At 804, a first voltage of the bus of different voltages is provided to an on-die low-pass filter to yield a filtered voltage, the low-pass filter having a cutoff frequency lower than a resonant frequency of voltage droops to be detected on the SoC's power grid. In one or more embodiments, the low-pass filter may comprise an RC filter combined with a switch capacitor that filters the first voltage down to a suitable frequency relative to the resonant frequency of the voltage droops; e.g., approximately 5 MHz or otherwise lower than 10 MHz.

At 806, the filtered voltage obtained at step 804 is provided to an on-die unit-gain amplifier to yield a reference voltage. The unity-gain amplifier can yield, as the reference voltage, a buffered version of the filtered voltage obtained at step 804. In one or more embodiments, the offset of the unity-gain amplifier may be substantially minimized using any suitable circuit design technique (e.g., offset auto-cancellation or other methods). At 808, the reference voltage obtained at step 806 is provided as a first input to an on-die comparator. At 810, a second voltage of the bus of different voltage obtained at step 802 is provided as a second input to the comparator for comparison with the reference voltage obtained at step 806.

At 812, the output of the comparator is synchronously sampled (e.g., using an on-die sampling circuit) to determine when the supply voltage on the SoC's power grid (represented by the second voltage provided at step 810) has experienced a droop relative to the reference voltage. At 812, an output signal is generated in response to detection of a supply voltage droop based on the sampled output of the comparator.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for detecting voltage droops, comprising:
    a voltage reference generator component comprising a low-pass filter component and a unity-gain amplifier, wherein the voltage reference generator is configured to convert a supply voltage of a power distribution network of an integrated circuit to a reference voltage, wherein the low-pass filter component is configured to perform low-pass filtering on at least a portion of the supply voltage to yield a filtered voltage, and wherein the unity-gain amplifier is configured to output, as the reference voltage, a buffered version of the filtered voltage; and
    a comparator component configured to generate a comparison result output signal in response to a determination that a transient voltage representing the supply voltage has deviated from the reference voltage in excess of a margin.

2. The system of claim 1, further comprising a sampling component configured to synchronously sample the comparison result output signal and to generate a droop detection signal in response to detection of the comparison result output signal.

3. The system of claim 2, further comprising a logic control component configured to modify a frequency of a system clock signal in response to detection of the droop detection signal.

4. The system of claim 1, wherein the low-pass filter is configured to produce, as the filtered voltage, a transiently averaged sampled output of at least the portion of the supply voltage over time.

5. The system of claim 1, wherein the voltage reference generator component further comprises a voltage divider component configured to divide the supply voltage into a bus of different voltages, and wherein at least the portion of the supply voltage is a voltage of the bus of different voltages.

6. The system of claim 5, wherein the transient voltage comprises another voltage of the bus of different voltages.

7. The system of claim 1, wherein the voltage reference generator component, the comparator component, the low-pass filter component, and the unity-gain amplifier component are on-die components of the integrated circuit.

8. The system of claim 1, wherein the low-pass filter component is configured to perform time-averaging of at least the portion of the supply voltage to yield the filtered voltage.

9. A method of detecting droops in supply voltage, comprising:
    converting, by one or more on-die components of an integrated circuit, a supply voltage of a power distribution network of an integrated circuit to a reference voltage, wherein the converting comprises performing a low-pass filtering on at least a portion of the supply voltage to yield a filtered voltage and generating, as the reference voltage, a buffered version of the filtered voltage; and
    generating, by the one or more on-die components, a comparison result signal in response to determining that a transient voltage representing the supply voltage has deviated from the reference voltage in excess of a margin.

10. The method of claim 9, further comprising:
    synchronously sampling, by the one or more on-die components, the comparison result signal; and
    outputting, by the one or more on-die components, a droop detection signal in response to detecting the comparison result signal.

11. The method of claim 10, further comprising modifying, by the one or more on-die components, a frequency of a system clock signal used by the integrated circuit in response to detecting the droop detection signal.

12. The method of claim 9, wherein the performing the low-pass filtering comprises performing a transient averaged sampling of at least the portion of the supply voltage over time.

13. The method of claim 9, wherein the converting further comprises dividing the supply voltage to yield a bus of different voltages, and wherein at least the portion of the supply voltage is one of the different voltages.

14. The method of claim 13, wherein the transient voltage comprises another of the different voltages.

15. The method of claim 9, wherein the performing the low-pass filtering comprises performing time-averaging of at least the portion of the supply voltage to yield the filtered voltage.

16. An integrated circuit, comprising:
a power distribution network that provides a supply voltage to one or more integrated components of the integrated circuit;
a voltage divider component configured to divide the supply voltage into a bus of different voltages;
a low-pass filter component configured to generate a transiently averaged sampled version of a first voltage of the bus of different voltages, wherein the low-pass filter component filters the transiently averaged sampled version of the first bus voltage to approximately one-tenth of system resonant frequency to yield a filtered voltage;
a unity-gain amplifier component configured to buffer the filtered voltage to yield a reference voltage;
a comparator component configured to compare the reference voltage with a second voltage of the bus of different voltages and to generate a comparison result signal in response to determining that the second voltage has deviated from the reference voltage in excess of a tolerance; and
a sampling component configured to synchronously sample the comparison result signal and to output a droop detection signal in response to detecting the comparison result output signal.

17. The integrated circuit of claim 16, further comprising a logic control component configured to adjust a frequency of a system clock signal in response to detecting of the droop detection signal.

18. The integrated circuit of claim 16, wherein the low-pass filter component comprises a set of series-connected metal-oxide-semiconductor field-effect transistors (MOSFETs) in series to a capacitor, a first switched capacitor connected through a first switch to a first node that connects one of the series-connected MOSFETS to the capacitor, and a second switched capacitor connected through a second switch to a second node that connects the first switched capacitor to the first switch.

* * * * *